United States Patent
Kasahara et al.

(10) Patent No.: US 6,690,574 B2
(45) Date of Patent: Feb. 10, 2004

(54) ELECTRONIC APPARATUS

(75) Inventors: Nobumitsu Kasahara, Kawagoe (JP); Takahiro Sasaki, Kawagoe (JP); Akira Shimizu, Kawagoe (JP)

(73) Assignee: Pioneer Corporation, Tokyo-To (JP)

( * ) Notice: Subject to any disclaimer, the term of this patent is extended or adjusted under 35 U.S.C. 154(b) by 11 days.

(21) Appl. No.: 10/123,884

(22) Filed: Apr. 17, 2002

(65) Prior Publication Data

US 2002/0176235 A1 Nov. 28, 2002

(30) Foreign Application Priority Data

May 24, 2001 (JP) ........................................ 2001-154850

(51) Int. Cl.[7] .............................................. G11B 33/02
(52) U.S. Cl. ...................... 361/683; 361/680; 361/681; 360/99.02; 360/97.02; 369/75.1; 369/75.2
(58) Field of Search ................................ 361/680, 683, 361/799, 681, 814, 826; 360/93, 96.5, 97.02, 99.02, 99.06, 99.12, 137, 247; 369/10, 21, 11, 12, 75.1, 75.2, 93, 297, 77.1, 77.2; 248/27.3; 16/260, 268; 341/35; 434/307 A

(56) References Cited

U.S. PATENT DOCUMENTS 5,010,437 A * 4/1991 Utsugi et al. ................ 360/137
5,177,730 A * 1/1993 Utsugi ........................ 369/75.1
5,848,042 A * 12/1998 Takahashi et al. ......... 369/75.1
5,852,594 A * 12/1998 Kaise et al. ................ 369/75.1
5,953,302 A * 9/1999 Kobayashi ................. 369/75.1
6,398,168 B1 * 6/2002 O Tae ....................... 248/273.3

FOREIGN PATENT DOCUMENTS

| JP | 409045062 A | * | 2/1997 | ........... G11B/33/02 |
| JP | 02001007542 A | * | 1/2001 | ............ H05K/5/02 |

* cited by examiner

*Primary Examiner*—Darren Schuberg
*Assistant Examiner*—Michael Datskovsky
(74) *Attorney, Agent, or Firm*—Morgan, Lewis & Bockius LLP

(57) ABSTRACT

An electronic apparatus includes a moving support member moving in a back-and-forth direction of the electronic apparatus, an upper-end support member for supporting an upper end of a front panel in a movable manner, and a lower-end support member supported to the moving support member in a rotary manner, in which when the moving support member moves to the front side of the electronic apparatus, the upper-end support member moves the upper end of the front panel in such a manner that the front side surface of the front panel may face the upward and also restricts the inclination of the front panel by means of the upper-end support member while accordingly turning the lower-end support member as holding up the lower end of the front panel.

6 Claims, 12 Drawing Sheets

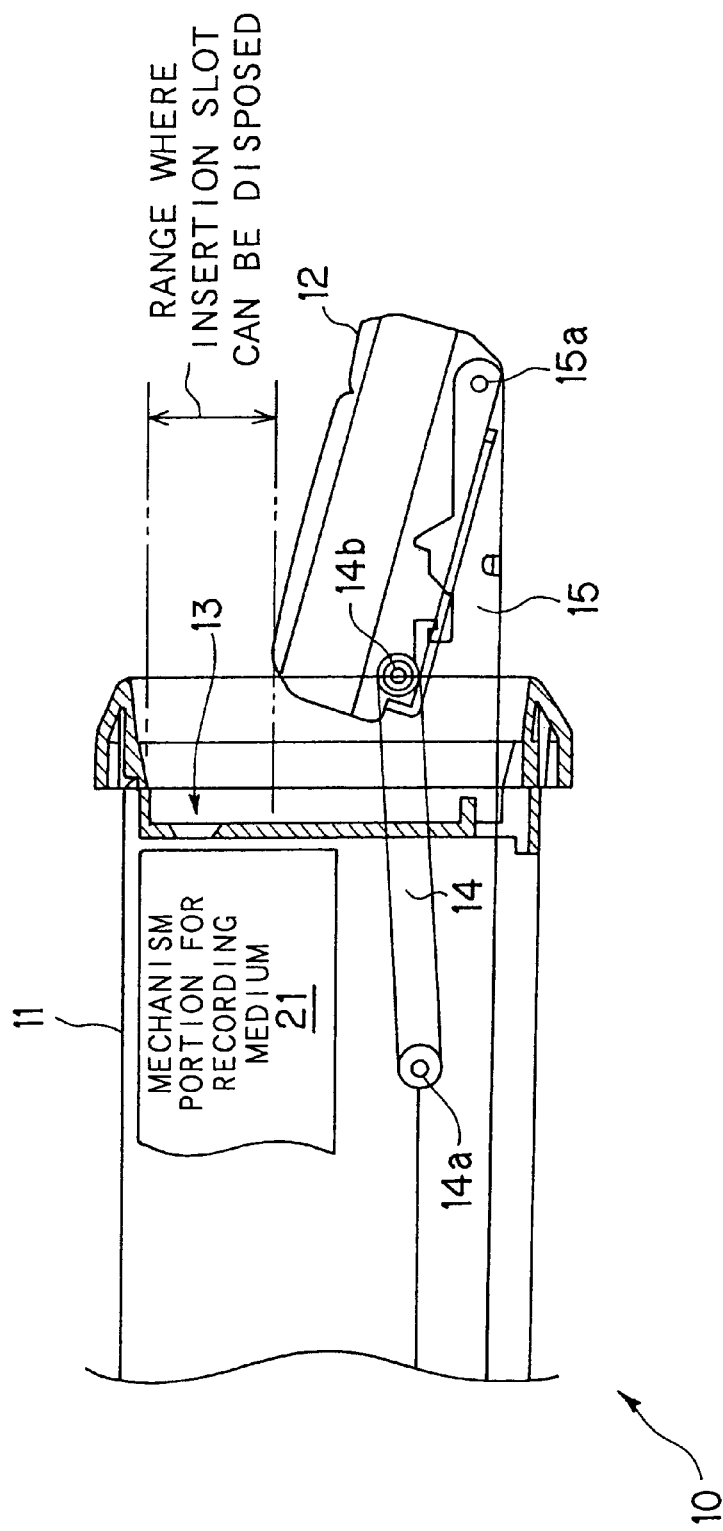

INTERFERENCE OCCURS

VISUAL RECOGNITION ANGLE

CARD TYPE RECORDING MEDIUM

ELECTRONIC APPARATUS

BACKGROUND OF THE INVENTION

1. Field of the Invention

The present invention relates to a technical field of an electronic apparatus and, more particularly to a technical field of an electronic apparatus equipped with a front panel movably supported to the electronic apparatus.

2. Description of the Related Art

Recently, an electronic apparatus such as an audio or navigation device has been widely used as mounted in a vehicle such as an automobile.

The cabinet itself of such an electronic apparatus is typically mounted inside a dashboard of the vehicle, so that because of a necessity of space saving and design restrictions an operation switch for setting operation of the electronic apparatus, a display screen for displaying the operation thereon, etc. are generally disposed on the front panel of the electronic apparatus.

Furthermore, in the case of such an electronic apparatus, its insertion slot for inserting a recording medium such as a CD (Compact Disc) or MD (mini Disc) is disposed on such an inner wall surface of this electronic apparatus as to be exposed by moving the front panel thereof, a typical configuration of which electronic apparatus is shown in FIG. 7.

An electronic apparatus 10 shown in FIG. 7 comprises: a front panel 12 disposed movable over a housing position (which is shown in FIG. 7A) in a recess shaped front holder 11b provided at the front portion of a cabinet 11 and a expansion position (which is shown in FIG. 7B) at which an inner wall surface 11a of the front holder 11b is exposed on the front side of the electronic apparatus 10; an insertion slot 13 provided on the inner wall surface 11a for inserting a recording medium such as a CD or MD; an upper end support member 14 attached in a rotary manner to the cabinet 11 for supporting an upper end of the front panel 12 and moves the front panel 12; and a moving support member 15 attached to the cabinet 11 in such a manner as to move in the back-and-forth direction of the electronic apparatus 10 for supporting a lower end of the front panel 12.

The upper end support member 14 has its one end portion 14a attached to the cabinet 11 so that it may be attached in a rotary manner to the cabinet 11 with that one end portion 14a acting as a supporting point. Moreover, the upper end support member 14 has it's the other end portion 14b attached to the upper end of the front panel 12 so that it can support the upper end of the front panel 12 in such a manner that when it has turned around the one end portion 14a as the supporting point, a rear part of the front panel 12 may be inclined backward with respect to the electronic apparatus 10 (or that the front panel 12 inclined may be erected).

The moving support member 15 has its one end portion 15a attached to the lower end of the front panel 12 so that it may support the lower end of the front panel 12 in such a manner as to turn it around the one end portion 15a as a rotary axis while it moves as driven by a drive portion not shown in the back-and-forth direction of the electronic apparatus 10.

In the electronic apparatus 10 having such a configuration, the lower end of the front panel 12 at the housing position can be pushed as turning to the front side of the electronic apparatus 10 when the moving support member 15 moves to the front side of the electronic apparatus 10. Then, the upper end support member 14 is adapted to turn around the one end portion 14a as a supporting point to thereby incline the rear part of the front panel 12 backward with respect to the electronic apparatus 10. Therefore, front panel 12 is moved to the expansion position.

Furthermore, when the front panel 12 is at the expansion position, the inner wall surface 11a hidden by the front panel 12 hitherto is exposed on the front side of the electronic apparatus 10, so that this inner wall surface 11a is provided with the insertion slot 13 for inserting a recording medium therethrough, thus improving the utilization efficiency of the space in front of the electronic apparatus 10.

In these years, on the other hand, a small sized card type recording medium referred to as a memory card has been used commonly, while recently such card type recording medium is adapted to store data used in the above-mentioned type of electronic apparatus so that the data may be used commonly by this electronic apparatus and a personal computer in the home or by a plurality of electronic apparatuses.

In an electronic apparatus having the above-mentioned configuration, however, as shown in FIG. 8, there is a restriction imposed on the exposed space (space where the insertion slot can be disposed) when the front panel 12 is moved to the expansion position and also a restriction imposed on the positional relationship between the insertion slot 13 and a mechanism portion 21 such as the reproduction mechanism portion of a recording medium disposed in the cabinet 11. It is, therefore, difficult to dispose the insertion slot 13 for inserting a recording medium such as a CD or MD and also an insertion slot for inserting a card type recording medium in the inner wall surface 11a.

That is, to dispose the insertion slot for inserting a card type recording medium as well as the insertion slot 13, it is necessary to have the exposed space more in the inner wall surface 11a and, taking into account a positional relationship between the insertion slot for inserting a card type recording medium and a mounting portion for mounting the card type recording medium, it is also necessary to increase a movement distance of the front panel 12.

For example, as shown in FIG. 9, it is necessary to dispose in the inner wall surface 11a both the insertion slot 13 for inserting a recording medium such as a CD or MD and an insertion slot 22 for inserting a card type recording medium such as a memory card in such a manner that when they are positioned vertically one over the other, the front panel 12 may be moved as protruding out of the range where the electronic apparatus 10 is mounted inside the dashboard, that is, a range of the external profile of the electronic apparatus 10.

In this case, however, there occurs such a problem that the front panel 12 as protruded out of the external profile of the electronic apparatus 10 may hit any other apparatus is mounted inside the dashboard.

Furthermore, for example, as shown in FIG. 10, even if the movement distance of the front panel 12 is increased without protruding it out of the external profile of the electronic apparatus 10 as much as possible, the operation switch etc. on the front surface of the front panel 12 interferes with the movement, thus giving rise to a problem of poor workability in insertion/ejection of the card type recording medium at the insertion slot 22.

To solve these problems, there is a method for attaching a mounting portion, which mounts a card type recording medium, to the moving support member 15. The mounting portion mounts the card type recording medium so that when the moving support member 15 has moved to the front side of the electronic apparatus 10, the insertion slot in the mounting portion itself may be exposed on the front side of the electronic apparatus 10. Such a configuration example of the electronic apparatus 10 is described below.

In FIGS. 11A, 11B, 11C, and 11D, the electronic apparatus 10 is provided, at the side end portion of the moving support member 15 on the side of the front panel 12, with an inclined support member 24 that has a predetermined length and that is inclined upward with respect to the front panel 12 in such a configuration that the tip portion 15a of this inclined support member 24 is a little shifted toward upward from the lower end of the front panel 12. In this configuration, when the moving support member 15 moves to the front side of the electronic apparatus 10, the lower end of the front panel 12 turns around the tip portion 15a as a rotary axis, to thereby expose the insertion slot in a card type recording medium housing portion 23 itself from the rear part side of the front panel 12 thus moved to the expansion position to the forward side of the electronic apparatus 10.

Furthermore, in FIGS. 12A, 12B, 12C, and 12D, the electronic apparatus 10 is provided in configuration with a support member 25 having a predetermined length, at the end portion of the moving support member 15 on the side of the front panel 12. This support member 25 has its one end portion 25a attached in a rotary manner to the moving support member 15 and has it's the other end portion 25b to the lower end of the front panel 12. In this configuration, when the moving support member 15 moves to the front side of the electronic apparatus 10, the support member 25 turns around the one end 25a as a supporting point upward with respect to the front panel 12, while at the same time the lower end of the front panel 12 turns around the other end 25b as a rotary axis to thereby expose the insertion slot in the card recording medium housing portion 23 itself from the rear part side of the front panel 12 thus moved to the expansion position to the front side of the electronic apparatus 10.

In this configuration, as the front panel 12 is moved to the expansion position, the insertion slot in the card type recording medium housing portion 23 can be exposed on the front side of the electronic apparatus 10, thus eliminating the necessity of increasing the movement distance of the front panel 12.

In the electronic apparatus 10 having the configuration of FIGS. 11, however, as shown in FIG. 11D, when the front panel 12 is moved to the expansion position, the insertion slot in the card type recording medium housing portion 23 cannot sufficiently be exposed on the front side of the electronic apparatus 10 because of a restriction on the predetermined length of the inclined support member 24, thus giving rise to a problem that this insertion slot is hidden by the shadow of the front panel 12 to thus extremely reduce the visually recognizable angle of the user. This results in poor workability in insertion/ejection of a card type recording medium for the user.

Furthermore, in the electronic apparatus 10 with the configuration of FIG. 12, the support member 25 turns the lower end of the front panel 12 as turning upward with respect to the front panel 12 (that is, as holding up the lower end of the front panel 12). Accordingly, as shown in FIG. 12B, there occurs such a problem that the upper end of the front panel 12 hits the front holder 11b to thus interferes with the movement of the front panel 12.

SUMMARY OF THE INVENTION

The present invention has been made in view of the above problems, an object thereof is, therefore, to provide an electronic apparatus which can preserve a space exposed on the front side of the electronic apparatus when a front panel of the electronic apparatus is moved, thus improving workability in insertion/ejection of a recording medium by a user.

The above object of present invention can be achieved by an electronic apparatus of the present invention. The electronic apparatus is provided with: a front panel for having a lower end attached to the electronic apparatus so that the front panel turns around the lower end as a rotary axis; and a panel drive mechanism for inclining the front panel so that a front side surface of the front panel faces upward, for moving the lower end in a back-and-forth direction of the electronic apparatus so that the front panel as inclined is erected, and for having a moving support member for moving in the back-and-forth direction of the electronic apparatus, a lower-end support member for having one end attached to the lower end of the front panel to tern the front panel and other end attached to the moving support member so that the lower-end support member turns around, an upper-end support member for supporting an upper end of the front panel so that the upper end moves, and a restriction member for restricting inclination of the front panel while the panel drive mechanism inclines the front panel, wherein when the moving support member moves to the front side of the electronic apparatus, the restriction member restricts the inclination of the front panel, while at the same time turning the lower-end support member as holding up the lower end of the front panel.

According to the present invention, a restriction member restricts inclination operation of a front panel while at the same time turning the lower-end support member as holding up the lower end of the front panel.

Accordingly, it is possible to incline the front panel smoothly and to preserve a relatively large space on the rear side of the inclined front panel.

In one aspect of the present invention, the electronic apparatus is further provided with; the restriction member has a guide groove formed roughly obliquely upward from the front side to the back side of the electronic apparatus; the guide groove has, at a roughly central portion of the guide groove, a parallel portion formed parallel to a direction in which the moving support member moves; the upper-end support member has one end supporting the upper end of the front panel so that the upper end moves and the other end fit in the guide groove so that the other end moves; and when the moving support member moves to the front side of the electronic apparatus, the restriction member moves the other end of the upper-end support member along the guide groove to restrict the inclination of the front panel.

According to the present invention, the other end of an upper-end support member is moved along a guide groove to control the inclination operation of the front panel.

Accordingly, it is possible to restrict the inclination operation in a simple configuration. Moreover, because the other end of the upper-end support member is moved along the guide groove so that the turning of the lower-end support member is not affected, it is possible to restrict the inclination operation of the front panel securely.

In one aspect of the present invention, the electronic apparatus is further provided with; after inclining the front panel at angle set up beforehand, the restriction member uses the parallel portion to move the other end of the upper-end support member parallel to itself and turns the lower-end support member as holding up the lower end of the front panel; and after the lower end of the front panel turns, the restriction member releases the parallel movement of the other end of the upper-end support member to incline the front panel.

According to the present invention, after inclining the front panel at angle set up beforehand, the restriction member uses the parallel portion to move the other end of the upper-end support member parallel to itself and turns the lower-end support member as holding up the lower end of the front panel; and after the lower end of the front panel turns, the restriction member releases the parallel movement of the other end of the upper-end support member to incline the front panel.

Accordingly, it is possible to incline the front panel to such an angle as not to interfere with the turning of the lower-end support member and to turn the front panel. Moreover, it is possible to do the turning of the lower-end support member smoothly, namely, to incline of the front panel smoothly for the purpose of preserving a space on the rear side of the front panel.

In one aspect of the present invention, the electronic apparatus is further provided with; the moving support member is provided with a recording medium housing portion for housing a card type recording medium detachably; and when the panel drive mechanism has inclined the front panel so that the front side of the front panel faces upward, an insertion slot provided in the recording medium housing portion for inserting the card type recording medium is exposed to a region formed in the rear side surface of the front panel of the front side of the electronic apparatus.

According to the present invention, the moving support member is provided with a recording medium housing portion for housing a card type recording medium detachably, and when the panel drive mechanism has inclined the front panel so that the front side of the front panel faces upward, an insertion slot provided in the recording medium housing portion for inserting the card type recording medium is exposed to a region formed in the rear side surface of the front panel of the front side of the electronic apparatus.

Accordingly, because the insertion slot can not be shadowed by the front panel when a user inserts a card type recording medium into the insertion slot or when the user pulls out the card type recording medium from the insertion slot, it is possible to improve the visual recognition by the user as well as workability in insertion/ejection of a card type recording medium.

Furthermore, because the insertion slot in the recording medium housing portion can be exposed on the rear side of the front panel as pushed down, it is possible to enable separating the respective mechanism components of two types of recording media (e.g., a recording medium such as a CD and a card type recording medium such as a memory card) between the upper and lower parts of the front panel pushed down and to provide a layout coordinating a positional relationship between these mechanisms and the mechanism in the cabinet.

BRIEF DESCRIPTION OF THE DRAWINGS

FIG. 8 is an illustration for showing a problem of the conventional electronic apparatus;

DESCRIPTION OF THE PREFERRED EMBODIMENTS

The following will describe preferred embodiments of the present invention with reference to the drawings.

One embodiment described below with reference to FIGS. 1–6 is based on a premise that the present invention is applied to a construction of an electronic apparatus such as a vehicle-mounted audio device.

First the construction of the embodiment is described with reference to FIGS. 1–4.

Figure 1A:
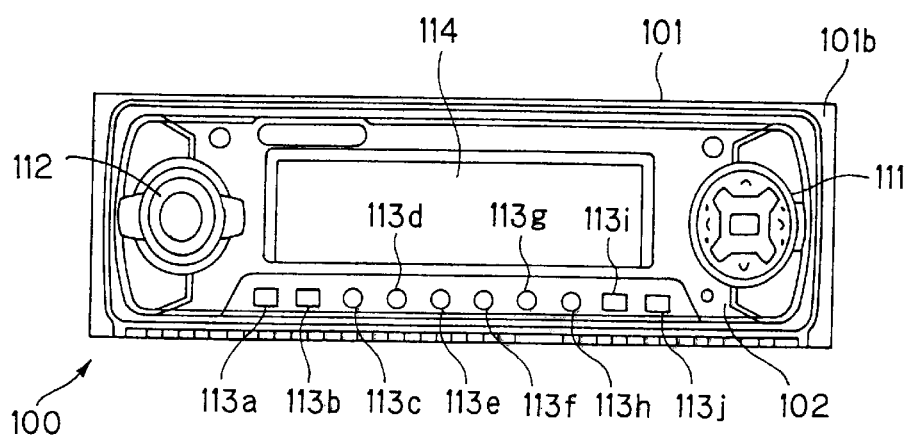
FIG. 1A shows a state where a front panel is housed as seen in a front view of one embodiment of an electronic apparatus according to the present invention.
Figure 1B:
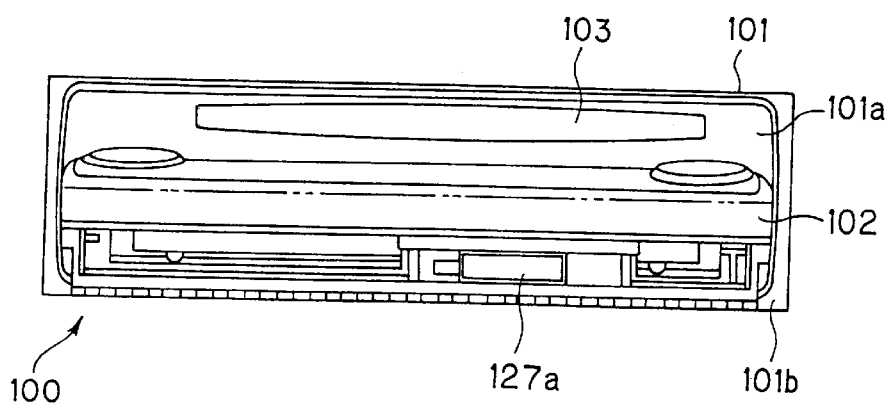
FIG. 1B shows a state where it is expanded as seen in a front view of one embodiment of an electronic apparatus according to the present invention.
Figure 2A:
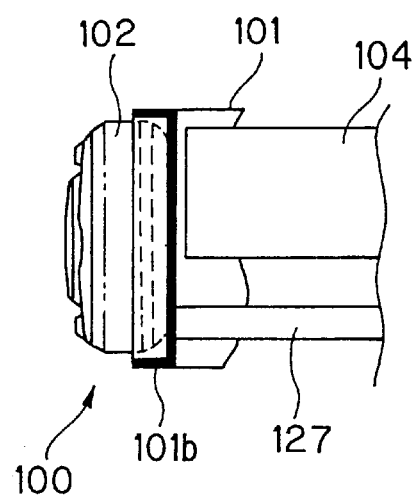
FIG. 2A shows a state where the front panel is housed as seen in a side view of the one embodiment of the electronic apparatus according to the present invention.
Figure 2B:
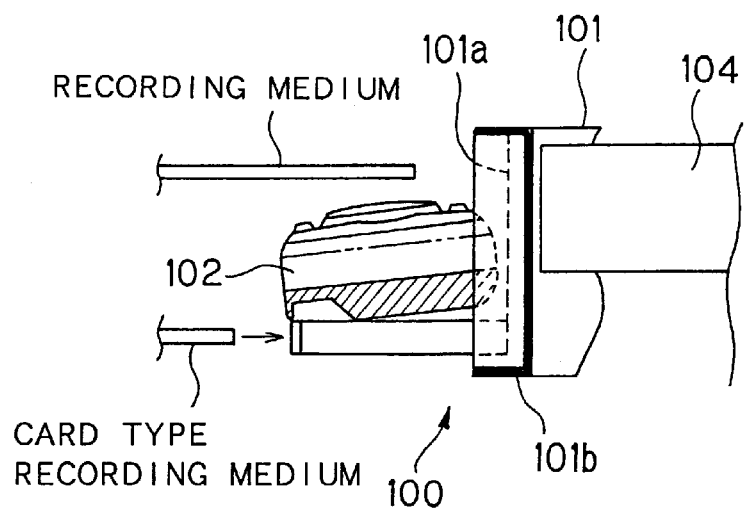
FIG. 2B shows a state where it is expanded as seen in a side view of the one embodiment of the electronic apparatus according to the present invention.

Note here that FIG. 1A shows a state where a front panel is housed and FIG. 1B shows a state where it is expanded, as seen in a front view of an electronic apparatus according to the present invention. FIG. 2A shows a state where the front panel is housed and FIG. 2B shows a state where it is expanded, as seen in a side view of the one embodiment of this electronic apparatus.

Figure 3A:
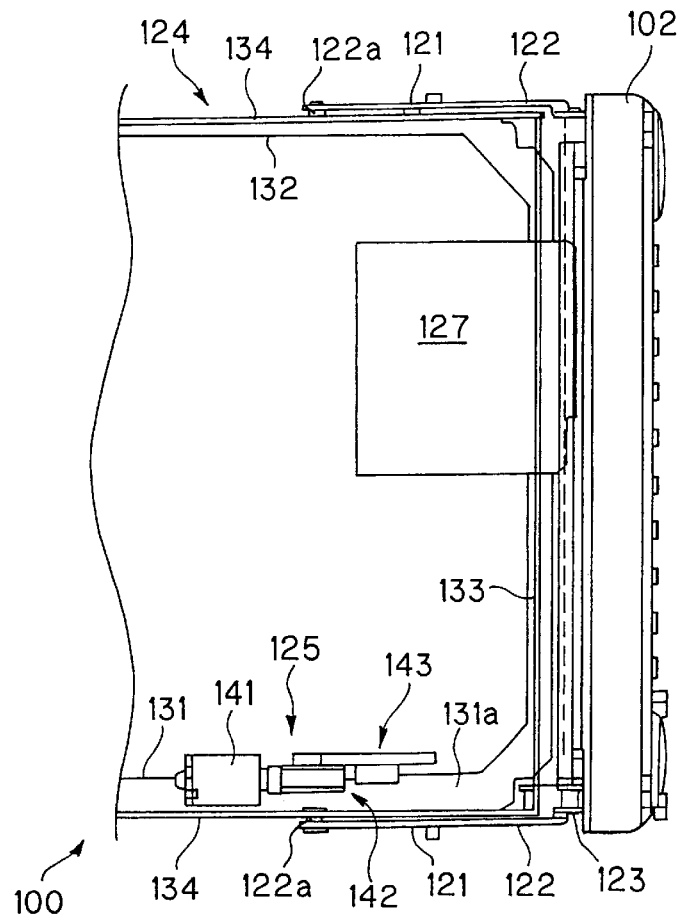
FIG. 3A shows an inner side surface as viewed downward for illustrating an inner construction of the one embodiment of the electronic apparatus according to the present invention.
Figure 3B:
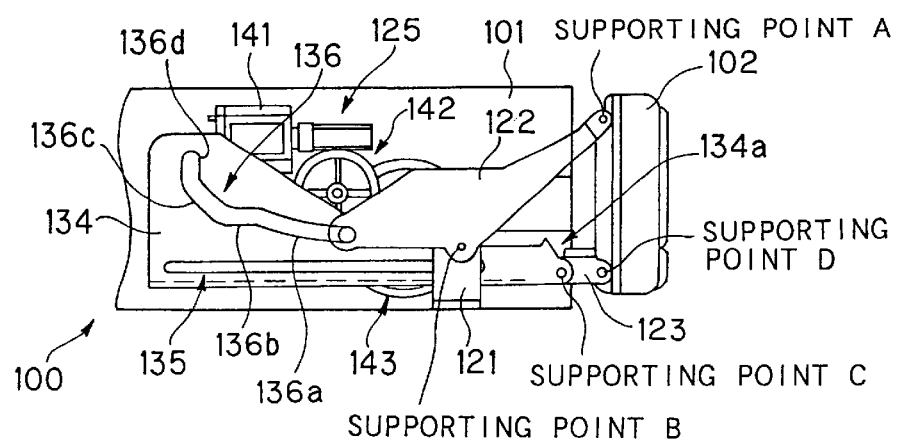
FIG. 3B shows an inner side surface as viewed sideward for illustrating an inner construction of the one embodiment of the electronic apparatus according to the present invention.
Figure 4A:
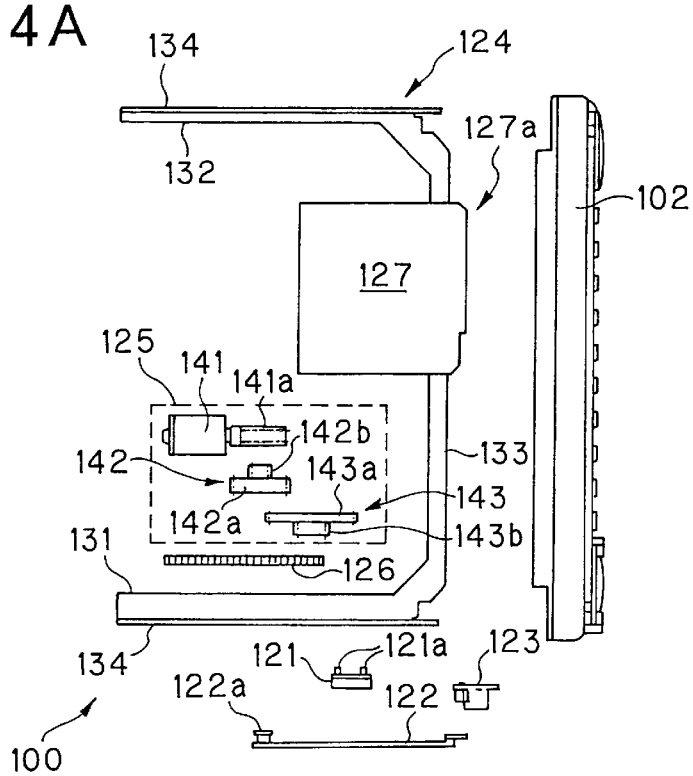
FIG. 4A shows an exploded inner surface as viewed downward for illustrating the inner construction of the one embodiment of the electronic apparatus according to the present invention.

Furthermore, FIG. 3A shows an inner side surface as viewed downward and FIG. 3B shows an inner side surface as viewed sideward, for illustrating the inner construction of this electronic apparatus. FIG. 4A shows an inner surface as viewed downward and FIG. 3B shows an inner surface as viewed sideward, for illustrating the inner construction on one side surface of the apparatus.

An electronic apparatus 100 shown in FIGS. 1 and 2 comprises: a front panel 102 movable between a housing position (shown in FIG. 1A) where the front panel 102 is housed in a recess-shaped front holder 101b provided in a cabinet 101 of the electronic apparatus 100 and an expansion position (shown in FIG. 1B) where an inner wall surface 101a of the front holder 101b is exposed on the front side of the electronic apparatus 100; a first insertion slot 103 provided in the inner wall surface for inserting a recording medium such as a CD or MD; and a recording medium mechanism portion 104 having a reproduction mechanism etc. for mounting a recording medium inserted through the first insertion slot 103 to a predetermined reproduction position to thereby read out data recorded on the recording medium.

The front panel 102 is equipped with operation portions 111 and 112, operation buttons 113a–113j, and a display 114 for displaying an operation situation set by a user, thus permitting him to set and confirm the operation of the electronic apparatus 100.

This front panel 102 stands, at the housing position, roughly perpendicular to a direction in which a recording medium is inserted through the insertion slot 103 and, at the expansion position, has its rear part pushed down behind the electronic apparatus 100 in such a manner that its lower end may protrude to the front side of the electronic apparatus 100 and its front part on which the operation portions 111 etc. are arranged may face upward.

Figure 4B:
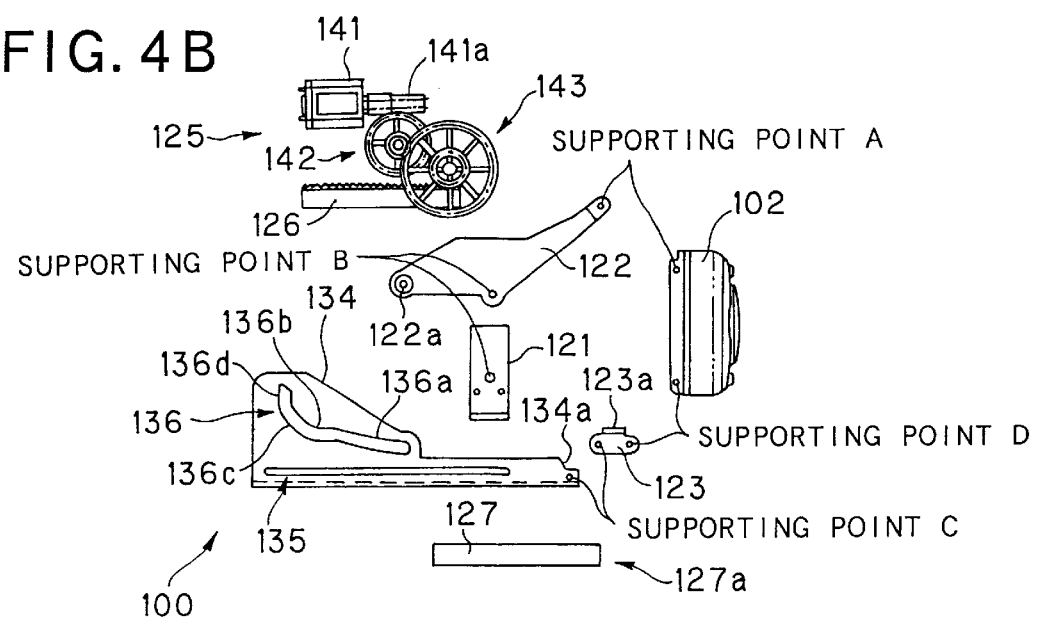
FIG. 4B shows an exploded inner surface as viewed sideward for illustrating the inner construction of the one embodiment of the electronic apparatus according to the present invention.

Furthermore, as shown in FIGS. 3 and 4, the electronic apparatus 100 comprises as a mechanism for moving the front panel 100 between the housing position and the expansion position: an upper-end support member 122 attached in a rotary manner to a fixed member 121 fixed to the cabinet 101; a lower-end support member 123 for supporting the lower end of the front panel 102 in a rotary manner; a moving support member 124 movably supported to the fixed member 121 for supporting the lower-end support member 123 in a rotary manner; and a drive mechanism portion 125 disposed on one side surface for driving the moving support member 124 in the back-and-forth direction of the electronic apparatus 100.

The fixed member 121, which is plate shaped, is fixed partially to the bottom surface of the cabinet 101 in such a manner that it is parallel to each of the two side surfaces of the cabinet 101.

Furthermore, the fixed member 121 has two shafts 121a and 122a which protrude into the cabinet 101 and inserted through a later-described slide groove 135 in the moving support member 124 to thereby support the moving support 124 movably.

The upper-end support member 122 has its one end (which is indicated as a supporting pint A in FIG. 3B) attached to the upper end of the front panel 102. Moreover, at the other end thereof is provided the shaft 122a, which is fit into the later-described guide 136 in the moving support member 124 in a movable manner.

The upper-end support member 122 has its roughly central lower portion attached to the fixed member 121 in a rotary manner. And the lower portion serves as a supporting portion (which is indicated as a supporting point B in FIG. 3B) when both ends thereof swing up and down alternately.

Then, the supporting point A of the upper-end support member 122 moves from the higher side to the lower side of the inner wall surface 101a with respect to the supporting point B, to move the upper end of the front panel 102 in such a manner that its front side surface may face upward.

The moving support member 124 comprises: a roughly rectangle-shaped first lateral member 131 which is arranged on the side of one side surface of the cabinet 101 and formed along this one side surface; a roughly rectangle-shaped second lateral member 132 which is arranged on the side of the other side surface of the cabinet 101 and formed along this the other side surface; a linkage member 133 for linking these first lateral member 131 and second lateral members 132 with each other; and a plate member 134 which has a surface parallel to each of the side surfaces of the cabinet 101 from each of the first and second lateral members 131 and 132 and formed along roughly all the length of these members 131 and 132.

Furthermore, the first and second lateral members 131 and 132 are each disposed near the fixed member 121 fixed to the bottom surface of the cabinet.

The plate member 134 is provided with the slide groove 135 which is formed parallel to a direction in which the moving support member 134 moves. Moreover, the plate member 134 is formed in such a manner that width may gradually increases over a range from its roughly central portion to the rear side of the electronic apparatus 100. And the plate member 134 is formed the guide groove 136 which has a predetermined curve shape along the range.

The guide groove 136 is provided with: an inclined portion 136a which is formed as moderately inclined upward over a range from roughly the center of the plate member 134 to the rear side of the electronic apparatus 100; parallel portion 136b which is formed over a range from an end of this inclined portion 136 on the side of the rear part of the electronic apparatus 100 toward the rear side of the electronic apparatus 100 parallel to the direction in which the moving support member 124 moves; a curved portion 136c which is formed as curved upward over a range from an end of this parallel portion 136b on the side of the back side of the electronic apparatus 100 to the back side of the electronic apparatus 100; and a perpendicular portion 137d which is formed upward from an end of this curved portion 136c on the back side of the electronic apparatus 100.

Through the slide groove 135 are inserted the shafts 121a and 122a of the fixed member 121, while in the guide groove 136 is fit the shaft 122b disposed at the other end of the upper-end support member 122.

In this configuration, the shafts 121a and 122a can move along the slide groove 135 to thereby move the moving support member 124 parallel to the bottom surface of the cabinet 101 and also, the shaft 122a can move through the inclined portion 136a, the parallel portion 136b, the curved portion 136c, and the perpendicular portion 136c of the guide groove 136 to thereby restrict the inclination operation of the front panel 102.

Furthermore, at the end portion of the plate member 134 on the side of the front panel 102 is attached the lower-end support member 123 in a rotary manner. At the end portion also is formed an inclined strip 134a in such a direction as to be separated away from the front panel 102 and upward from its roughly central portion in the width direction.

This inclined strip 134a is adapted to restrict the turning of the lower-end support member 123 in such a manner that when the lower-end support member 123 is turned, it is abutted by a protrusion 123a provided to the lower-end support member 123.

The lower-end support member 123 has its one end (which is indicated by a supporting point D in FIG. 3B) attached to the lower end of the front panel 102. This lower end of the front panel 102 can be turned around the supporting point D as a rotary axis. Moreover, the other end (which is indicated by the supporting point C in FIG. 3B) is attached in a rotary manner to an end of the plate member 134 of the moving support member 124 on the side of the front panel 102. In this configuration, when the moving support member 124 moves in the back-and-forth direction of the electronic apparatus 100, the lower end of the front panel 102 turns around the supporting point D as a rotary axis, thus turning the lower-end support member 123 with respect to the supporting point C.

Note here that when the front panel 102 moves from the housing position to the expansion position, the lower-end support member 123 turns around the supporting point C as holding up the lower end of the front panel 102.

Furthermore, to the linkage member 133 of the moving support member 124 is attached a recording medium housing portion 127 for housing a card type recording medium such as a memory card detachably. This recording medium housing portion 127 is provided with an insertion slot 127a for inserting a card type recording medium as opposed to the rear side surface of the front panel 102. In this configuration, the insertion slot 127a is adapted to be exposed on the front side of the electronic apparatus 100 when the front panel 102 has moved to the expansion position.

The drive mechanism portion 125 comprises: a motor 141 for generating a driving force; a worm gear 141a attached to the motor 141; a rack 126 fixed to an upper surface 131a of the first lateral member 131; and a first gear 142 and a second gear 143 for transferring the driving force of the motor 141 to the rack 126.

The first gear 142 has a small-diameter gear 142a and a large-diameter gear 142b, which are disposed co-axially with each other. Moreover, the large-diameter gear 142b meshes with the worm gear 141a. The second gear 143 has a small-diameter gear 143a and a large-diameter gear 143b, which are disposed co-axially with each other. In addition, the large-diameter gear 143b meshes with the small-diameter gear 143a of the first gear 142, while the small-diameter gear 143a meshes with the rack 126.

In this configuration, when the motor 141 is revolved in the normal direction, for example, its driving force is transferred from the worm gear 141a through the first and second gears 142 and 143 to the rack 126, thus moving the moving support member 124 to the front side of the electronic apparatus 100. When the motor 141 is revolved in the reversed direction, the moving support member 124 is moved to the back side of the electronic apparatus 100.

The following will describe a series of the operations for moving the front panel 102 according to this embodiment from the housing position to the expansion position with reference to FIGS. 5A, 5B, 5C, and 5D.

Figure 5A:
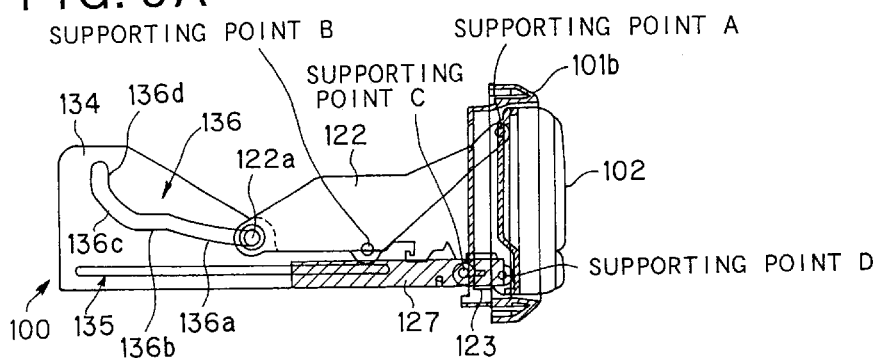
FIG. 5A shows a state where the front panel is housed for illustrating expansion of the front panel according to the one embodiment.
Figure 5B:
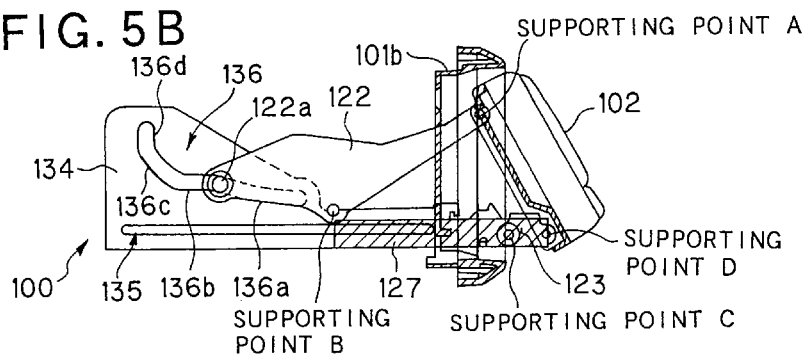
FIG. 5B show a state where the front panel and other components exit the housed state and enter to an expanded state for illustrating expansion of the front panel according to the one embodiment.
Figure 5C:
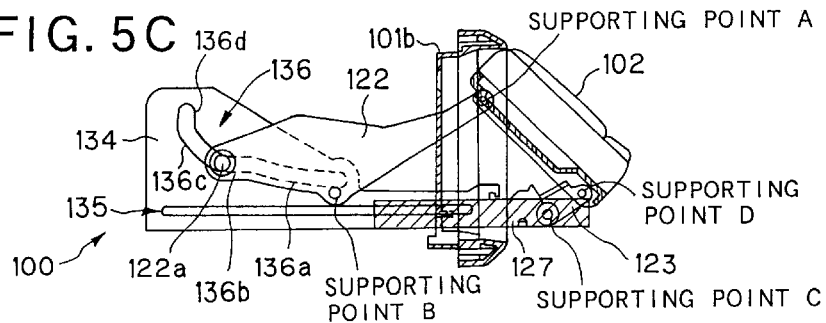
FIG. 5C show a state where the front panel and other components exit the housed state and enter to an expanded state for illustrating expansion of the front panel according to the one embodiment.
Figure 5D:
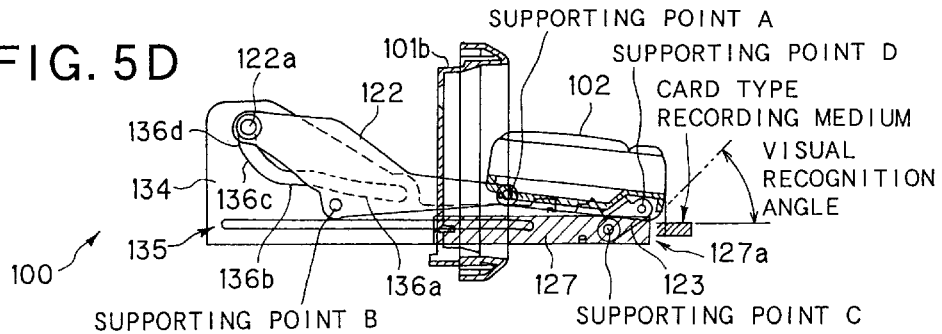
FIG. 5D shows a state where the front panel is expanded for illustrating expansion of the front panel according to the one embodiment.

Note here that FIGS. 5A, 5B, 5C, and 5D show the series of operations for moving the front panel 102 from the housing position to the expansion position, of which FIG. 5A shows a state where the front panel 102 is at the housing position and FIG. 5D shows a state where the front panel 102 is at the expansion position. Moreover, FIGS. 5B and 5C show a state where the front panel 102 and other components move from the housing position to the expansion position.

First, when the user operates the operation switch 113a etc. on the front surface of the front panel 102 in a state where the front panel 102 is at the housing position, the motor 141 is rotary-driven in the normal direction, to then turn the first and second gears 142 and 143 in order to transfer the driving force of the motor 141 to the rack 126, thus starting to move the moving support member 124 to the front side of the electronic apparatus 100.

Note here that when the front panel 102 is at the housing position, the shaft 122a of the upper-end support member 122 is located at the end of the inclined portion 136a of the guide groove 136 on the side of the front panel 102. The lower-end support member 123, on the other hand, is located parallel to the direction in which the moving support member 124 moves as shown in FIG. 5A.

When the moving support member 124 subsequently moves to the front side of the electronic apparatus 100, the lower end of the front panel 102 comes out to the front side of the electronic apparatus 100 and, at the same time, the lower end thereof starts to turn around the supporting point as a rotary axis, Correspondingly, the shaft 122a of the upper-end support member 122 is moved along the inclined portion 136a of the guide groove 136, while at the same time the upper-end support member 122 is turned around the supporting point B. Then, the upper end of the front panel 102 is inclined with respect to the supporting point A of the upper-end support member 122 in such a manner that the front side surface of the front panel 102 may face upward.

When the shaft 122a subsequently reaches an end of the inclined portion 136a on the rear side of the electronic apparatus 100, the front panel 102 is inclined by a predetermined angle. At this moment, the lower-end support member 123 is held parallel to the direction in which the moving support member 124 moves (see FIG. 5B).

When the moving support member 124 subsequently moves to the front side of the electronic apparatus 100, the shaft 122a of the upper-end support member 122 starts to move along the parallel portion 136b of the guide groove 136. When the shaft 122a thus starts moving along the parallel portion 136b, the operation of moving the upper end of the front panel 102 with respect to the supporting point A of the upper-end support member 122 is stopped temporarily. That is, the turning around the supporting point B of the upper-end support member 122 is stopped temporarily.

When the moving support member 124 subsequently comes out of the electronic apparatus 100 and the front panel 102 starts turning around the supporting point A as a rotary axis, the lower-end support member 123 starts turning around the supporting point C as holding up the lower end of the front panel 102.

When the shaft 122a of the upper-end support member 122 subsequently reaches the end of the parallel portion 136d on the rear side of the electronic apparatus 100, the protrusion 123a of the lower-end support member 123 butts against the inclined strip 134a of the moving support member 124 to thereby stop the turning of the lower-end support member 123 (see FIG. 5C).

When the shaft 122a of the upper-end support member 122 subsequently starts moving along the curved portion 136d of the guide groove 136, the operation of moving the upper end of the front panel 102 with respect to the supporting point A of the upper-end support member 122, that is, the turning operation with respect to the supporting point B of the upper-end support member 122 is re-started. Then, after the front panel 102 is inclined smoothly, the shaft 122a of the upper-end support member 122 reaches the upper end of the perpendicular portion 136d.

At last, when the motor 141 is stopped in rotary driving, the moving support member 124 stops moving to the front side of the electronic apparatus 100, thus completing the moving of the front panel 102 to its expansion position. In this state, the insertion slot 103 in the inner wall surface 101a is exposed on the front side of the electronic apparatus 100 to thereby expose the insertion slot 127a in the recording medium housing portion 127 attached to the moving support member 124. Accordingly, the relatively large region is preserved on the rear side surface of the front panel 102 located at the expansion position (see FIG. 5D).

Thus, in this embodiment, the front panel 100 is adapted to shift from the housing position to the expansion position.

Note here that to shift the front panel 102 from the expanded state to the housed state, the above-mentioned operations are reversed.

Thus, by this embodiment, the front panel 102 can be inclined so that it front side surface may face upward, to thereby expose the inner wall surface 101a at the upper part of thus inclined front panel 102 and also, the front panel 102 can be inclined by holding up its lower end, thereby preserving an effective space at the lower part thereof.

Furthermore, when the moving support member 124 presses the lower end of the front panel 102 so that the front side surface of the front panel 102 may face upward, the upper-end support member 122 moves along the guide groove 136 to thereby control the inclination of the front panel 102 in order to avoid such contact with the cabinet as to occur when the upper-end support member 123 turns as holding up the lower end of the front panel 102, thus inclining the front panel 102 smoothly.

It is therefore possible to preserve a sufficient space at the lower part of the front panel 102 as inclined, and the insertion slot in the card type recording medium housing portion 127 can be exposed to the space by providing this card type recording medium housing portion 127 to the moving support member 124.

Figure 6A:
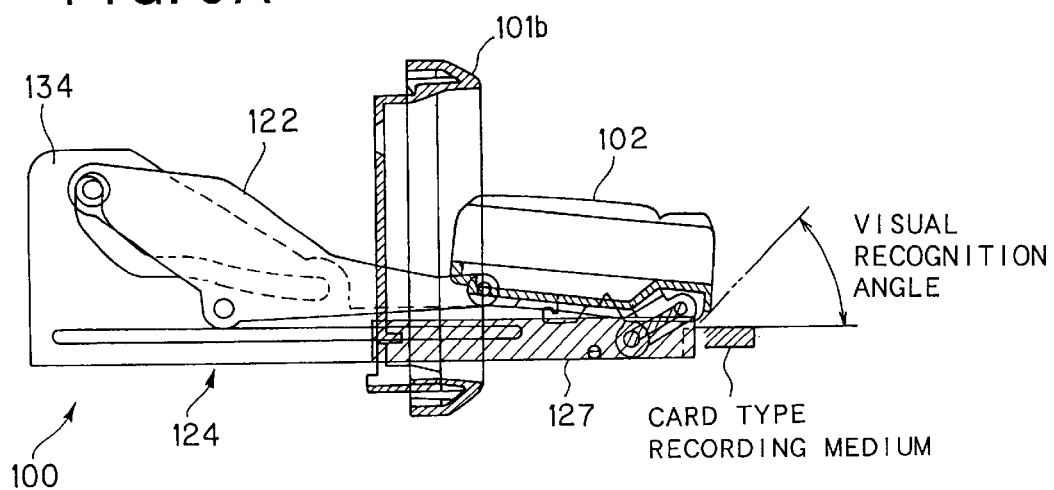
FIG. 6A shows a state where the electronic apparatus of the present invention is expanded in comparison of it and the conventional electronic apparatus as expanded.

Specifically, in the electronic apparatus according to this embodiment, as shown in FIG. 6A, the lower end of the front panel 102 is held up as restricting the inclination of the front panel 102 to thereby create a relatively large space on its rear part side, thus making it possible to protrude (move) the recording medium housing portion 127 more to the front side of the electronic apparatus 100.

Figure 6B:
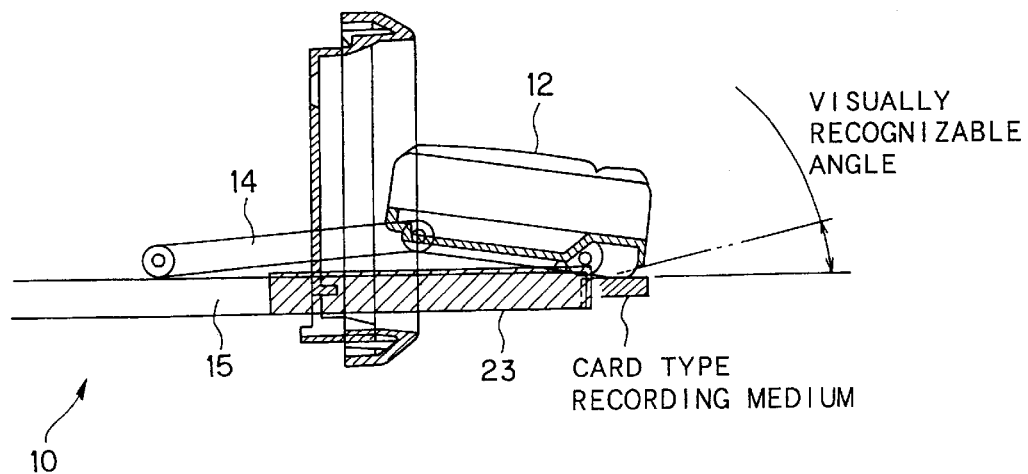
FIG. 6B shows a state where a conventional electronic apparatus is expanded in comparison of it and the electronic apparatus of the present invention as expanded.
Figure 7A:
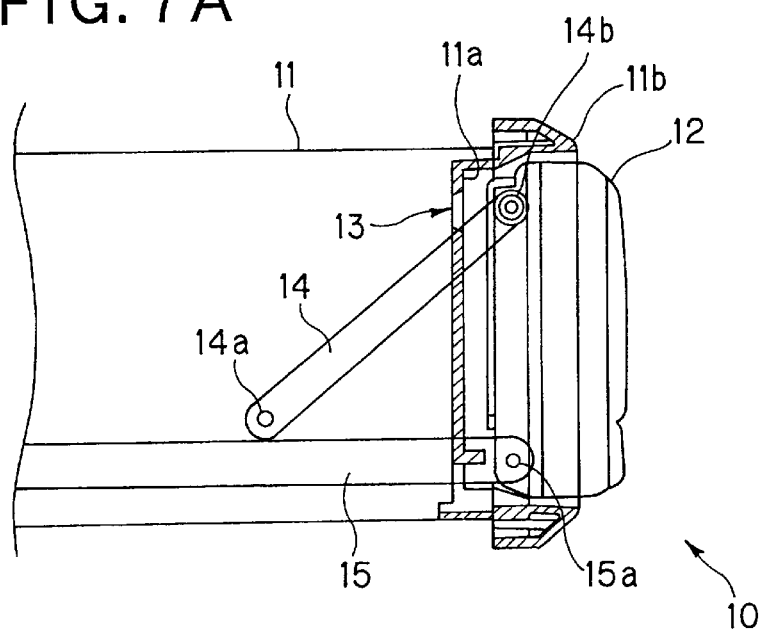
FIG. 7A is a side view for showing a state where the front panel of the conventional electronic apparatus is housed
Figure 7B:
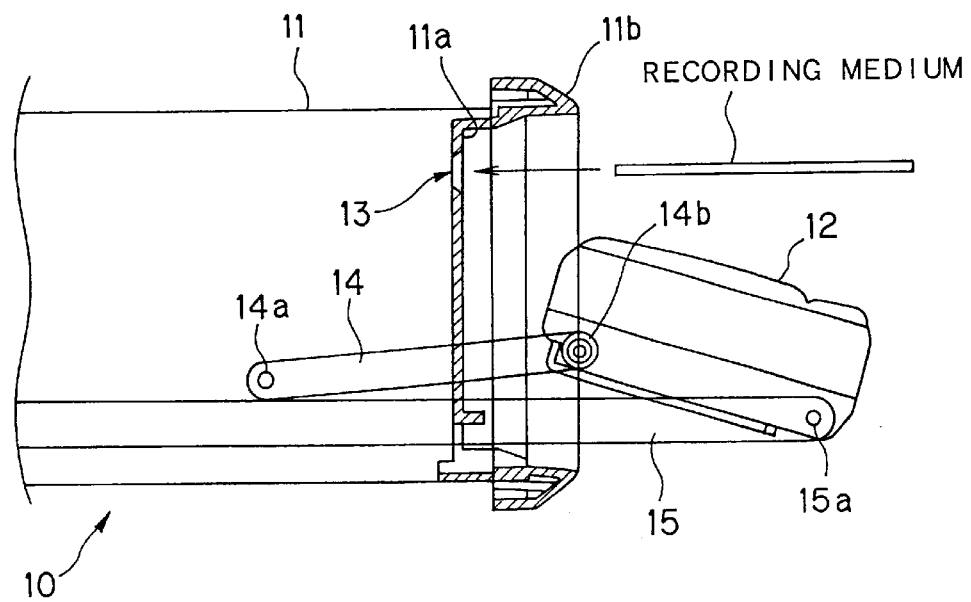
FIG. 7B is a side view for showing a state where he front panel of the conventional electronic apparatus is expanded.
Figure 9:
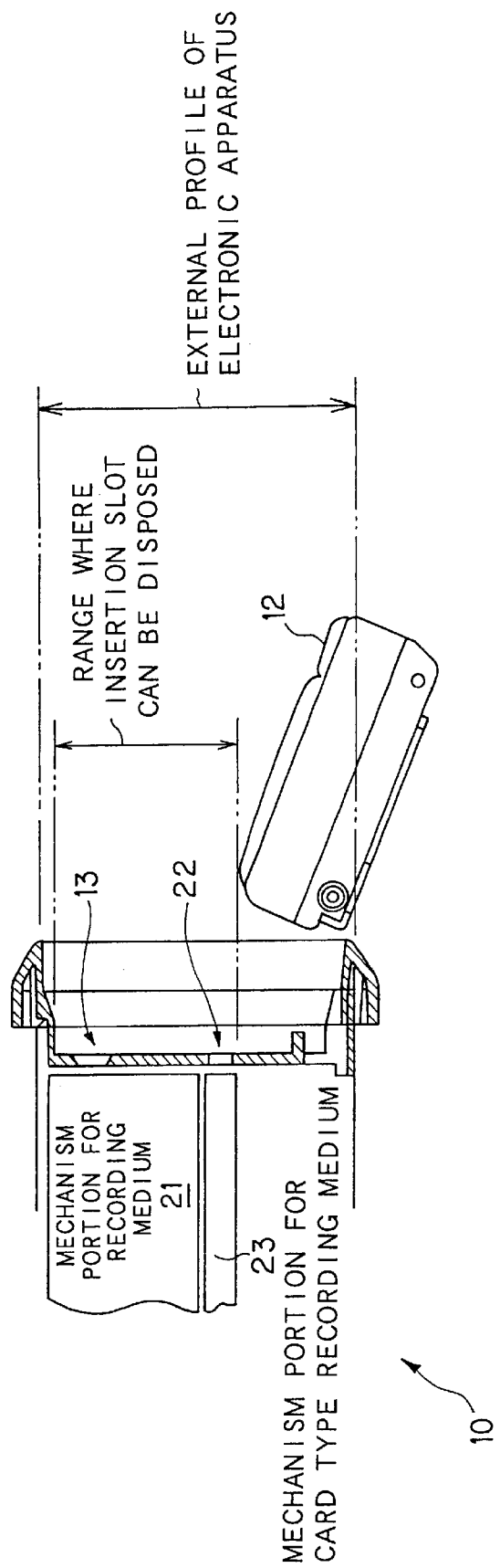
FIG. 9 is a side view for explaining the problem of the conventional electronic apparatus in a case of such a configuration that a lower end of the front panel is protruded forward with an upper end thereof as pushed down backward.
Figure 10:
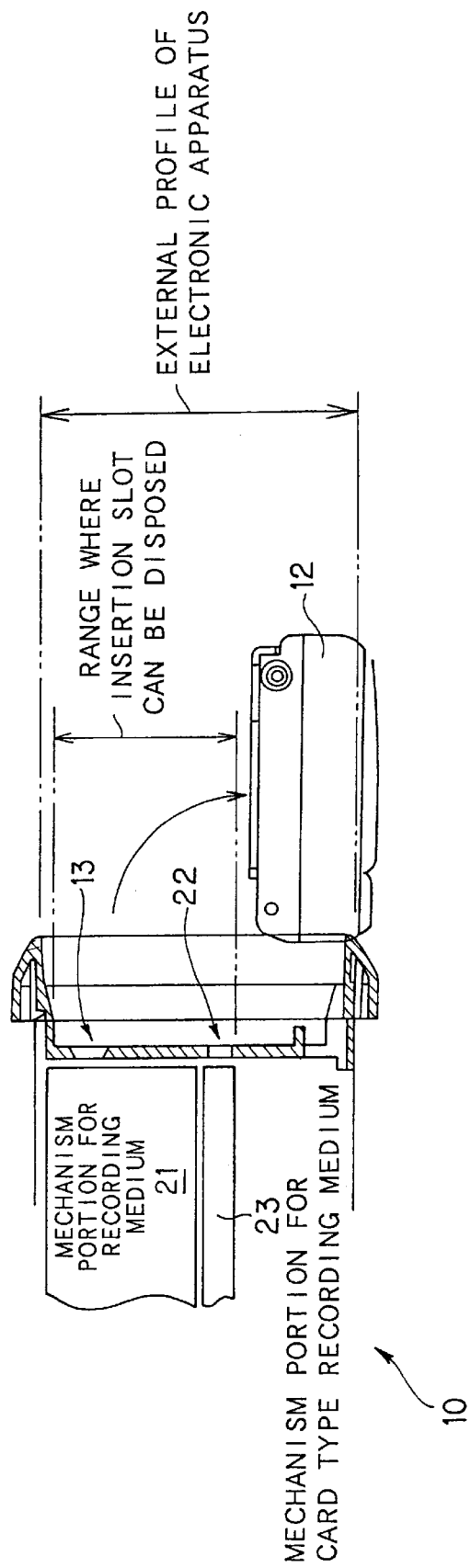
FIG. 10 is a side view for explaining the problem of the conventional electronic apparatus in a case of such a configuration that the upper of the front panel is pushed down with respect to the lower end thereof.
Figure 11A:
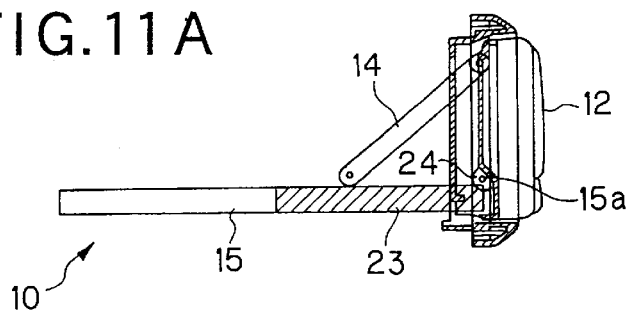
FIG. 11A is a side view for showing a state where the front panel is housed in the electronic apparatus to solve the conventional problem.
Figure 11B:
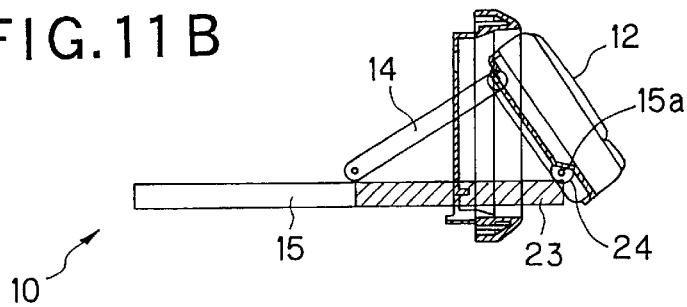
FIG. 11B is side views for showing a state where the front panel and other components exit the housed state and enter to an expanded state in the electronic apparatus to solve the conventional problem.
Figure 11C:
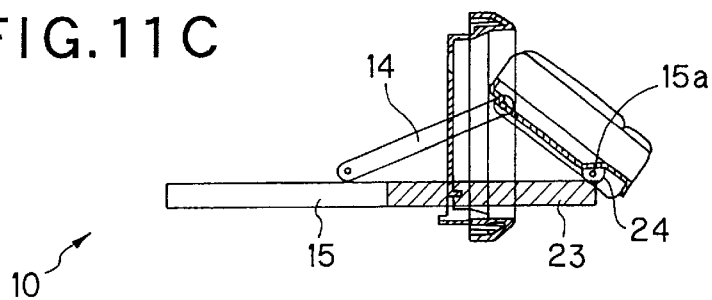
FIG. 11C is side views for showing a state where the front panel and other components exit the housed state and enter to an expanded state in the electronic apparatus to solve the conventional problem.
Figure 11D:
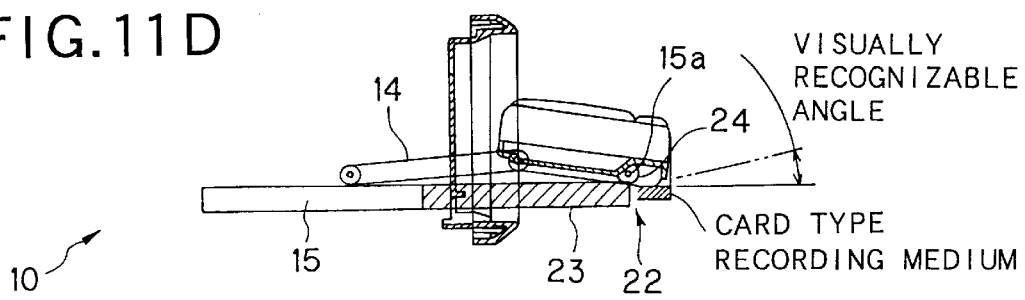
FIG. 11D is a side view for showing a state where the front panel is expanded in the electronic apparatus to solve the conventional problem.
Figure 12A:
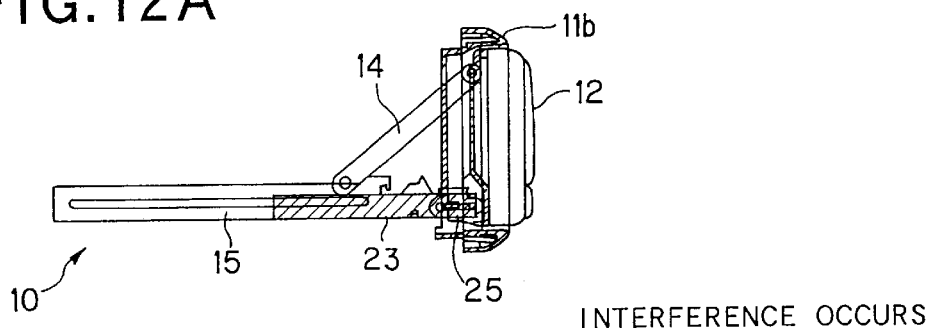
FIG. 12A is a side view for showing a state where the front panel is housed in the electronic apparatus to solve the conventional problem.
Figure 12B:
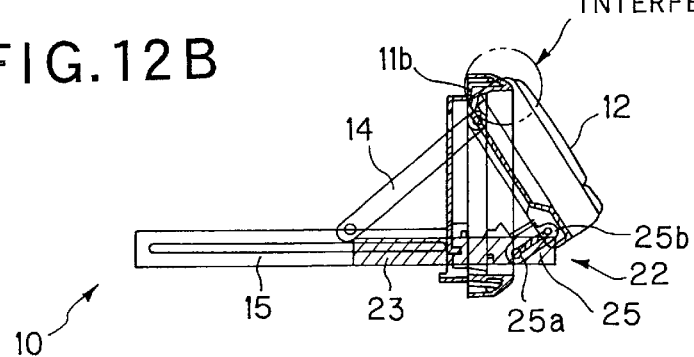
FIG. 12B is side views for showing a state where the front panel and other components exit the housed state and enter to an expanded state in the electronic apparatus to solve the conventional problem.
Figure 12C:
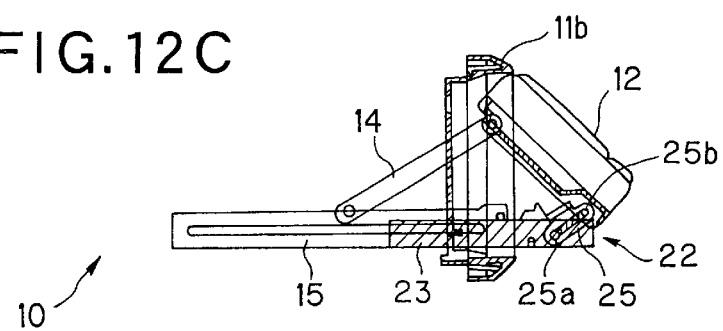
FIG. 12C is side views for showing a state where the front panel and other components exit the housed state and enter to an expanded state in the electronic apparatus to solve the conventional problem.
Figure 12D:
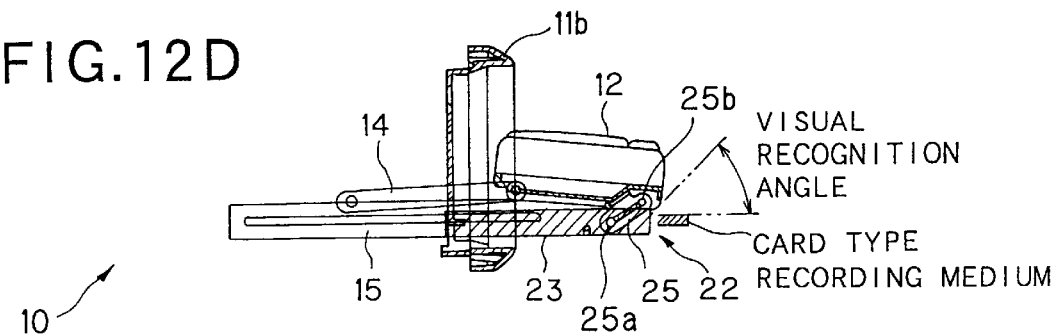
FIG. 12D is a side view for showing a state where the front panel is expanded in the electronic apparatus to solve the conventional problem.

In contrast, as shown in FIG. 6b, in the conventional electronic apparatus with the rotary axis as somewhat shifted upward with respect to the front panel 102, a large space cannot be created on the rear side of the front panel 102 as located a the expansion position, so that the recording medium housing portion 127 cannot sufficiently be protruded (moved) to the front side of the electronic apparatus 100.

As compared to the conventional electronic apparatus, the electronic apparatus according to this embodiment is capable of increasing the user's visually recognizable range of the insertion slot in the recording medium housing portion 127 for inserting a card type recording medium, thus improving the workability in insertion/ejection of the card type recording medium.

Note here that FIGS. 6A and 6B shows comparison between the electronic apparatus of this embodiment and the conventional one in terms of the state where the front panel is located at the expansion position, of which FIG. 6A shows a state where the front panel of the electronic apparatus of this embodiment is at the expansion position and FIG. 6B shows a state where that of the conventional electronic apparatus is at the expansion position.

Furthermore, according to this embodiment, a space can be preserved both at the upper and lower parts of the front panel as inclined instead of providing two types of insertion slots at the upper part of the inner wall surface 101a, to thereby separate the mechanism components of the two types of recording media from each other, thus providing a layout well accommodating the mechanism in the cabinet.

Additionally, although the embodiment of the present invention has been described with reference to the vehicle-mounted electronic apparatus, of course, it is applicable also to an in-house use.

The entire disclosure of Japanese Patent Application No. 2001-154850 filed on May 24, 2001 including the specification, claims, drawings and summary is incorporated herein by reference in its entirety.

What is claimed is:

1. An electronic apparatus comprising:
a front panel having a lower end attached to the electronic apparatus so that the front panel turns around the lower end as a rotary axis; and
a panel drive mechanism for inclining the front panel so that a front side surface of the front panel faces upward and moving the lower end in a back-and-forth direction of the electronic apparatus so that the inclined front panel is raised, and wherein the panel drive mechanism comprises:
a moving support member for moving in the back-and-forth direction of the electronic apparatus;
a lower-end support member for having one end attached to the lower end of the front panel to turn the front panel and other end attached to the moving support member so that the lower-end support member turns around;

an upper-end support member for supporting an upper end of the front panel so that the upper end moves; and a restriction member for restricting inclination of the front panel while the panel drive mechanism inclines the front panel, wherein when the moving support member moves to the front side of the electronic apparatus, the restriction member restricts the inclination of the front panel, while turning the lower-end support member so as to hold up the lower end of the front panel.

2. The electronic apparatus according to claim 1, wherein:

the restriction member has a guide groove formed obliquely upward from the front side to the back side of the electronic apparatus;

the guide groove has, at a central portion of the guide groove, a parallel portion formed parallel to a direction in which the moving support member moves;

the upper-end support member has one end supporting the upper end of the front panel so that the upper end moves and the other end fit in the guide groove so that the other end moves; and when the moving support member moves to the front side of the electronic apparatus, the restriction member moves the other end of the upper-end support member along the guide groove to restrict the inclination of the front panel.

3. The electronic apparatus according to claim 2, wherein:

after inclining the front panel at angle set up beforehand, the restriction member uses the parallel portion to move the other end of the upper-end support member parallel to itself and turns the lower-end support member so as to hold up the lower end of the front panel; and after the lower end of the front panel turns, the restriction member releases the parallel movement of the other end of the upper-end support member to incline the front panel.

4. The electronic apparatus according to claim 1, wherein:

the moving support member comprise a recording medium housing portion for housing a card type recording medium detachably; and when the panel drive mechanism has inclined the front panel so that the front side of the front panel faces upward, an insertion slot provided in the recording medium housing portion for inserting the card type recording medium is exposed to a region formed in the rear side surface of the front panel of the front side of the electronic apparatus.

5. The electronic apparatus according to claim 2, wherein:

the moving support member comprises a recording medium housing portion for housing a card type recording medium detachably; and when the panel drive mechanism has inclined the front panel so that the front side of the front panel faces upward, an insertion slot provided in the recording medium housing portion for inserting the card type recording medium is exposed to a region formed in the rear side surface of the front panel of the front side of the electronic apparatus.

6. The electronic apparatus according to claim 3, wherein:

the moving support member comprises a recording medium housing portion for housing a card type recording medium detachably; and when the panel drive mechanism has inclined the front panel so that the front side of the front panel faces upward, an insertion slot provided in the recording medium housing portion for inserting the card type recording medium is exposed to a region formed in the rear side surface of the front panel of the front side of the electronic apparatus.

* * * * *